United States Patent [19]

Arthur et al.

[11] Patent Number: 5,281,466
[45] Date of Patent: * Jan. 25, 1994

[54] LOW VOLUME FRACTION CERAMIC FILLED FLUOROPOLYMERIC COMPOSITE MATERIAL

[75] Inventors: David J. Arthur, Norwood; Gwo S. Swei, Northboro, both of Mass.; Allen F. Horn, III, Danielson; Brett Kilhenny, Storrs, both of Conn.

[73] Assignee: Rogers Corporation, Rogers, Conn.

[*] Notice: The portion of the term of this patent subsequent to Jun. 18, 2008 has been disclaimed.

[21] Appl. No.: 703,633

[22] Filed: May 22, 1991

Related U.S. Application Data

[63] Continuation-in-part of Ser. No. 641,427, Jan. 17, 1991, which is a continuation-in-part of Ser. No. 367,241, Jun. 16, 1989, Pat. No. 5,061,548, which is a continuation-in-part of Ser. No. 15,191, Feb. 17, 1987, Pat. No. 4,849,284, which is a continuation-in-part of Ser. No. 483,501, Feb. 21, 1990, Pat. No. 5,024,871.

[51] Int. Cl.⁵ ............................................. B32B 3/00

[52] U.S. Cl. .............................. 428/195; 428/325; 428/331; 428/405; 428/421; 428/422; 428/461; 428/901; 174/250

[58] Field of Search ............... 428/195, 325, 331, 421, 428/422, 405, 461, 901; 174/68.5

[56] References Cited

U.S. PATENT DOCUMENTS

5,024,871 10/1991 Arthur et al. ....................... 428/209

OTHER PUBLICATIONS

English Translation of JA. P. Appln: Kokai No: S57-134806 to Kureha Chemical Industries.

Primary Examiner—Patrick J. Ryan
Assistant Examiner—Elizabeth Evans
Attorney, Agent, or Firm—Fishman, Dionne & Cantor

[57] ABSTRACT

A composite material is presented comprised of a ceramic filled fluoropolymer wherein the ceramic is coated with a zirconate coupling agent and/or a titanate coupling agent and the ceramic has a volume % fraction of between about 26–45.

17 Claims, 1 Drawing Sheet

LOW VOLUME FRACTION CERAMIC FILLED FLUOROPOLYMERIC COMPOSITE MATERIAL

CROSS REFERENCE TO RELATED APPLICATION:

This is a continuation-in-part of U.S. Application Ser. No. 641,427 filed Jan. 17, 1991, which is a continuation-in-part of U.S. application Ser. No. 367,241 filed Jun. 16, 1989, now U.S. Pat. No. 5,061,548, (which, in turn, is a continuation-in-part of U.S. application Ser. No. 015,191 filed Feb. 17, 1987, now U.S. Pat. No. 4,849,284) and this is a continuation-in-part of U.S. application Ser. No. 483,501 filed Feb. 21, 1990, now U.S. Pat. No. 5,024,871.

BACKGROUND OF THE INVENTION

This invention relates to a fluoropolymeric composite material. More particularly, this invention relates to a fluoropolymeric composite material which is particularly well suited for use as a bonding ply in a multilayer circuit board and in other electronic circuit applications requiring the ability to flow as well as good thermal, mechanical and electrical properties. The fluoropolymeric composite material of this invention also exhibits resistance to chemical degradation, particularly high pH (alkaline) environments.

U.S. Pat. No. 4,849,284, which is assigned to the assignee hereof and incorporated herein by reference, describes a ceramic filled fluoropolymer-based electrical substrate material sold by Rogers Corporation under the trademark RO-2800. This electrical substrate material preferably comprises polytetrafluoroethylene filled with silica along with a small amount of microfiberglass. In an important feature of this material, the ceramic filler (silica) is coated with a silane coating material which renders the surface of the ceramic hydrophobic and provides improved tensile strength, peel strength and dimensional stability. The composite material of U.S. Pat. No. 4,849,284 discloses a volume % filler fraction (on a void free basis) of at least 50 for use as a circuit substrate or a bonding ply.

The ceramic filled fluoropolymer-based electrical substrate material of U.S. Pat. No. 4,849,284 is well suited for forming rigid printed wiring board substrate materials and exhibits improved electrical performance over other printed wiring board materials. Also, the low coefficients of thermal expansion and compliant nature of this electrical substrate material results in improved surface mount reliability and plated through-hole reliability. As is known, individual sheets of this electrical substrate material may be stacked to form a multilayer circuit board. In fact, thin film formulations of the material disclosed in U.S. Pat. No. 4,849,284 (and sold by Rogers Corporation under the trademark RO-2810) may be used as a bonding ply to bond together a plurality of stacked substrate layers so as to form the multilayer circuit board.

It will be appreciated that high volume fractions (greater than 55 volume %) of ceramic filler will significantly and adversely effect the rheology (e.g. flow) of the ceramic filled fluoropolymer composite. This is particularly important when the composite is used as a bonding film or in filling openings in previously rigid structures. While ceramic filler volume fractions of 50-55% provide significantly improved rheological properties relative to higher filler fractions, there is a Perceived need to provide even better flow properties to the fluoropolymeric composite without appreciably altering the excellent thermal, mechanical and electrical properties.

In addition to the adverse effects on rheology, it has also been determined that ceramic filler volume fractions of 50% and greater also have an adverse impact on the chemical resistance of the filled fluoropolymeric composite with respect to certain hostile environments, particularly high pH (alkaline) baths. Such high pH baths (e.g., greater than pH=12) are required for electroless copper deposition, which is a highly desirable and often used process in the manufacture of fine line circuitry (i.e., multichip modules). It has been found that high levels (50 volume % and greater) of ceramic filler may impart poor chemical resistance to the fluoropolymeric circuit material during long exposures in such alkaline baths. The resultant degradation caused by the poor resistance to the alkaline baths leads to a reduction in the hydrophobicity of the fluoropolymeric composite. In turn, this reduction leads to increased moisture absorption with a corresponding and highly undesirable decrease in the electrical properties of the composite circuit material.

SUMMARY OF THE INVENTION

In U.S. Ser. No. 367,241 filed Jun. 16, 1989, now U.S. Pat. No. 5,061,548 (assigned to the assignee hereof and fully incorporated herein by reference) it had been discovered that the ceramic filler content of the material disclosed in U.S. Pat. No. 4,849,284 may be as low as 45 volume % on a void-free basis and still retain adequate thermal, mechanical and electrical properties to be used as a bonding ply in multilayer circuit materials and as a filling material for certain rigid structures. The ceramic filled fluoropolymeric composite material of U.S. Ser. No. 367,241, now U.S. Pat. No. 5,061,548 has improved rheology relative to the material of U.S. Pat. No. 4,849,284 and is useful in those applications requiring access holes and feature filling by resin flow without an excessive increase in the material's z-axis CTE.

In U.S. Ser. No. 483,501 filed Feb. 21, 1990, now U.S. Pat. No. 5,024,871, (which is assigned to the assignee hereof and fully incorporated herein by reference), it had been discovered that the silane coating on the ceramic filler of the electrical substrate material disclosed in U.S. Pat. No. 4,849,284 may be replaced with zirconate coupling agents and/or titanate coupling agents and the resultant composite material will still retain the excellent thermal, mechanical and electrical properties as that described in U.S. Pat. No. 4,849,284.

In accordance with the present invention, it has now been discovered that the serious chemical degradation associated with the high filler content (e.g., 50% and greater) fluoropolymer composites of U.S. Pat. No. 4,849,284 during long exposure to high pH baths is reduced and/or alleviated by employing lower filler levels of as low as about 26 volume % on a void free basis. The ceramic is coated with a titanate and/or zirconate coating. The resultant ceramic filled composite has excellent mechanical and electrical properties; and exhibits a significant improvement (relative to composites of higher filler levels) in alkaline resistance. Accordingly, the present invention relates to a filled fluoropolymer composite containing 26-45 volume % titanate and/or zirconate coated ceramic.

The above-discussed and other features and advantages of the present invention will be appreciated and understood by those of ordinary skill in the art from the following detailed description and drawings.

BRIEF DESCRIPTION OF THE DRAWING

Referring now to the drawings.

DESCRIPTION OF THE PREFERRED EMBODIMENT

Figure 1A:
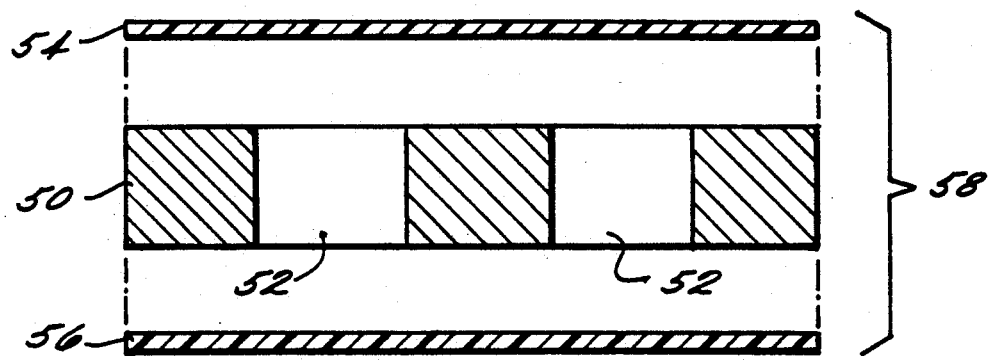
FIG. 1A and 1B are respective cross-sectional elevation views of a rigid structure having openings prior and subsequent to being filled with the composite material of the present invention.

The ceramic filled fluoropolymeric composite of the present invention is substantially similar to the composite described in U.S. Pat. No. 4,849,284, U.S. Ser. No. 367,241, now U.S. Pat. No. 5,061,548 and U.S. Ser. No. 483,501, now U.S. Pat. No. 5,024,871 (all three of which have been fully incorporated herein by reference) with the exception that the ceramic is present on a void-free basis in an amount of as low as about 26 volume %.

In a preferred embodiment, the first embodiment of the present invention comprises a composite of particulate ceramic filler present at a volume fraction of about 0.26 to less than 0.45 and fluoropolymer (e.g. PTFE) present at a volume fraction of 0.74 to 0.55 on a void-free basis. The preferred ceramic filler is fused amorphous silica, however other particulate siliceous fillers such as sand and clay may be used. In addition, reinforcement material such as fiberglass, solid glass beads and bulk glass panels in amounts of equal to or less than 2% (by weight) may be used. The ceramic filler is coated with a titanate and/or zirconate coating. All other compositional features and methods of manufacture are the same as that disclosed in U.S. Pat. No. 4,849,284. Accordingly, reference is to be made to U.S. Pat. No. 4,849,284 for those details. The materials comprising the present invention can be produced either by "wet blending" PTFE polymer in dispersion with the ceramic filler and coagulation or by dry blending of PTFE fine powders with the ceramic filler.

Suitable zirconate coupling agents include, but are not limited to neopentyl(diallyloxy)tri(dioctyl) pyrophosphate zirconate and neopentyl(diallyoxy)tri(N-ethylenediamino) ethyl zirconate which is available from Kenrich Petrochemicals, Inc. under the tradename LZ-44.

Suitable titanate coupling agents include neopantyl(-diallyl)oxy, trineodecanonyl titanate, neopentyl(diallyl-)oxy, tri(dodecyl)benzene-sulfonyl titanate, neopentyl(-diallyl)oxy, tri(dioctyl)phosphato titanate, neopentyl(-diallyl)oxy, tri(dioctyl)pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate; all of which are available from Kenrich Petrochemicals, Inc. under the tradename LICA.

Preferred zirconate and titanate coating for effecting the important features associated with the electrical substrate material of this invention is 1% by weight of the filler (ceramic) material.

The reduction in filler content to as low as about 26 volume % leads to significant increase in the resistance of the fluoropolymer composite material to alkaline environments. This increased resistance to alkaline environments is described in detail in U.S. Ser. No. 641,427 filed Jan. 17, 1991 (which is assigned to the assignee hereof and fully incorporated herein by reference) in connection with silane coatings. As disclosed in aforementioned U.S. Ser. No. 483,501, now U.S. Pat. No. 5,024,871, zirconate and titanate coatings will provide results approaching, if not equal to, those associated with silane. Thus, the titanate and/or zirconate coated ceramic filled fluoropolymer of this invention will exhibit the same or similar properties as silane coated composites.

It will be appreciated that the low filler levels (e.g., 27 and 37 volume %) in accordance with the present invention exhibit significantly improved chemical resistance with respect to the 50 volume % levels associated with the composite of U.S. Pat. No. 4,849,284. Thus, a filled fluoropolymeric circuit material composite of this invention having a filler level of about 26 to less than 45 volume % provide significant advantage relative to the material of both U.S. Ser. No. 356,241, now U.S. Pat. No. 5,061,548 (filler levels of 45 to less than 50 volume %) and U.S. Pat. No. 4,849,284 (filler levels of 50 volume % and greater).

By this reduction in filler content, the rheology of the material of the present invention is improved to the point that it will "flow" and fill comparatively large openings in thick metal foils or inner layers of circuitry that cannot be filled by some of the highly filled (greater than 55 volume % fraction) materials disclosed in U.S. Pat. No. 4,849,284.

An important feature of the present invention is the fact that the rheology is improved without excessively increasing the Z-axis coefficient of thermal expansion (CTE) of the material. The Z-axis CTE of the 30-45 volume % filler formulation has been measured to be considerably less than the widely used fiber reinforced PTFE over the temperature range of $-55°$ to $+125°$ C. (typically about 200 ppm/° C.) Multilayer circuit boards made from RO 2800 laminate bonded together with bonding ply layers of the present invention will exhibit an overall CTE considerably lower than that of a fiber reinforced PTFE board. The decreased CTE is important in increasing the reliability of plated through holes and vias to withstand thermal cycling and high temperature assembly.

Figure 1B:
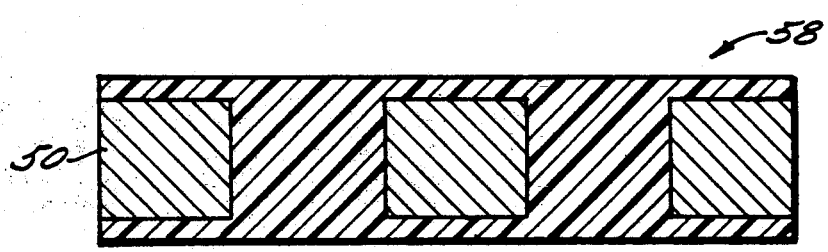

The present invention extends the number of applications in which ceramic filled PTFE composite materials can be used for constructing useful printed wiring boards. The present invention has the particular utility in filling openings in already rigid structures, such as etched CIC voltage or ground planes and restraining cores, or circuitry bonded to such structures. For example, in FIG. 1A, a rigid ground plane structure is depicted in cross-section at 50 several having openings 52. Sheets 54, 56 of the present invention (e.g., about 0.26 to 0.45 volume fraction ceramic) are then positioned on either side of ground plane 50. In FIG. 1B, the stack-up 58 of FIG. 1A is laminated under heat and pressure. The composition of this invention will permit good flow so as to completely fill the openings while also providing excellent thermal, mechanical and electrical properties.

Figure 2:
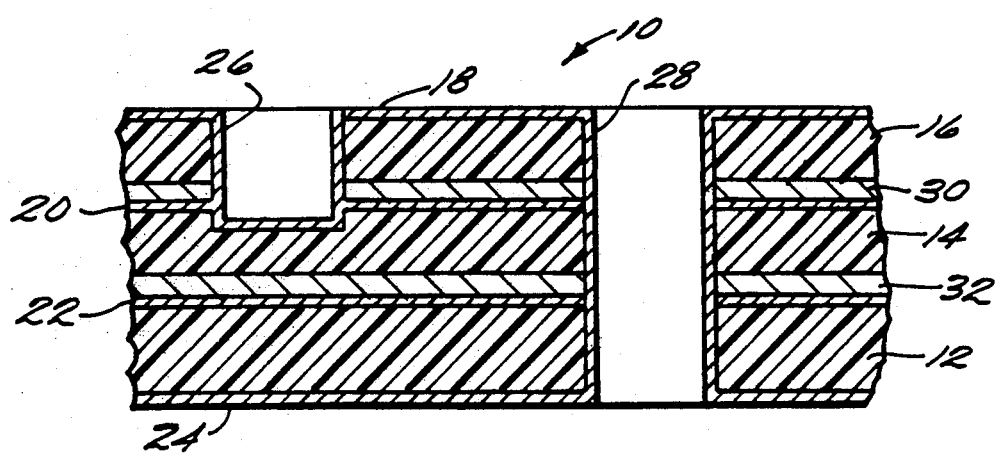
FIG. 2 is a cross-sectional elevation view of a multilayer circuit board employing the thermoplastic composite material in accordance with the present invention as a thin film bonding ply.

In addition and referring to FIG. 2, the composite of this invention may be processed into a sheet in its undensified, unsintered form and used for bonding multilayer printed wiring boards or constructing printed wiring boards by foil lamination. Turning now to FIG. 2, such a multilayer circuit board is shown generally at 10. Multilayer board 10 comprises a plurality of layers of substrate material 12, 14 and 16, all of which are comprised of an electrical substrate material, preferably the ceramic filled fluoropolymeric material of U.S. Pat. No 4,849,284, U.S. Ser. No. 367,241, now U.S. Pat. No. 5,061,548 U.S. Ser. No. 641,427 or U.S. Ser. No. 483,501, now U.S. Pat. No. 5,024,871. Each substrate layer 12, 14 and 16 has a conductive pattern 18, 20, 22 and 24 respectively thereon. Note that a substrate layer having a circuit pattern thereon defines a circuit substrate. Plated through holes 26 and 28 interconnect selected circuit patterns in a known manner.

In accordance with the present invention, separate sheets 30 and 32 of substrate material having a composition in accordance with the present invention are used as an adhesive or bond ply to laminate individual circuit substrates together. In a preferred method of forming such a laminate, a stack-up of circuit substrates altered with one or more layers of the bond ply is made. This stack-up is then fusion bonded whereby the entire multilayer assembly is melted and fused into a homogeneous construction with consistent electrical and mechanical properties throughout. Significantly, note that the adhesive bond ply layers 30 and 32 may be used to laminate circuit substrates comprised of materials other than the silane, titanate and/or zirconate coated ceramic filled fluoropolymers. Although, in a preferred embodiment, a multilayer circuit board includes circuit substrates which are all comprised of the electrical substrate material of the aforementioned ceramic filled fluoropolymers.

The highly filled composites referred to in U.S. Pat. 4,849,284 (e.g. 50+ vol % filler) are very suitable for most printed wiring board designs (e.g., large multilayer boards for mainframe computers (CPU boards), military surface mount assemblies and microwave circuit board bonded assemblies). However, for special MLB applications requiring thick voltage planes relative to the dielectric thickness (e.g., thick power planes, thick restraining foils for CTE control), a lower filler content is required (e.g., 45-50 vol %) to provide adequate flow, as indicated in aforementioned U.S. Ser. No. 367,241 (now U.S. Pat. No. 5,061,548). The lower filler amounts of about 26% to less than 45% in accordance with this invention is a response to the evolution of circuit process technology for the fabrication of multi chip modules which specifically require laser drilling of small holes, good flow, and alkaline resistance for electroless baths. The low filler amounts of this invention may not make a good conventional multilayer board (as will the material described in U.S. Pat. No. 4,849,284), but the material of U.S. Pat. No. 4,849,284 is not suitable for certain multi chip module applications which are emerging as a preferred packaging technology for high speed high density designs.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A nonconductive electrical substrate material comprising:
   fluoropolymeric material;
   ceramic filler material, said filler material being in an amount of at least about 26 to less than 45 volume percent of the total substrate material; and
   said ceramic filler being coated by a zirconate or titanate coating.

2. The material of claim 1 including:
   at least one layer of conductive material being disposed on at least a portion of said electrical substrate material.

3. The material of claim 1 wherein said fluoropolymeric material is selected from the group comprising:
   polytetrafluoroethylene, hexa fluoropropene, tetrafluoroethylene or perfluoro alkyl vinyl ether.

4. The material of claim 1 wherein said ceramic filler comprises silica.

5. The material of claim 1 wherein said zirconate coating is selected from the group comprising:
   neopentyl(diallyloxy)tri(dioctyl) pyro-phosphate zirconate and neopentyl(diallyoxy)tri(N-ethylenediamino) ethyl zirconate.

6. The material of claim 1 wherein said titanate coating is selected from the group comprising:
   neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

7. In a multilayer circuit including at least a first circuit layer and a second circuit layer, the improvement comprising:
   a nonconductive adhesive layer sandwiched between the first and second circuit layers, said adhesive layer comprising:
   fluoropolymeric material;
   ceramic filler material, said filler material being in an amount of at least about 26 to less than 45 volume percent of the total adhesive layer; and
   said ceramic filler being coated with a titanate or zirconate coating.

8. The multilayer circuit of claim 7 including:
   at least one plated through hole.

9. The multilayer circuit of claim 7 wherein said fluoropolymeric material is selected from the group comprising:
   polytetrafluoroethylene, hexa fluoropropene, tetrafluoroethylene or perfluoro alkyl vinyl ether.

10. The multilayer circuit of claim 7 wherein said ceramic filler comprises silica.

11. The multilayer circuit of claim 7 wherein said zirconate coating is selected from the group comprising:
    neopentyl(diallyloxy)tri(dioctyl) pyro-phosphate zirconate and neopentyl(diallyoxy)tri(N-ethylenediamino) ethyl zirconate.

12. The multilayer circuit of claim 7 wherein said titanate coating is selected from the group comprising:
    neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

13. An article comprising:
    a rigid substrate, said rigid substrate having at least one opening at least partially through said substrate;

a nonconductive composite material in said at least one opening, said composite material including:
fluoropolymeric material;
ceramic filler material, said filler material being in an amount of at least about 26 to less than 45 volume percent of the total composite material; and
said ceramic filler being coated by a titanate or zirconate coating.

14. The article of claim 13 wherein said fluoropolymeric material is selected from the group comprising:
polytetrafluoroethylene, hexa fluoropropene, tetrafluoroethylene or perfluoro alkyl vinyl ether.

15. The article of claim 13 wherein said ceramic filler comprises silica.

16. The article of claim 13 wherein said zirconate coating is selected from the group comprising:
neopentyl(diallyloxy)tri(dioctyl) pyro-phosphate zirconate and neopentyl(diallyoxy)tri(N-ethylenediamino) ethyl zirconate.

17. The article of claim 13 wherein said titanate coating is selected from the group comprising:
neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

* * * * *